United States Patent
Hui et al.

(10) Patent No.: US 9,019,020 B2
(45) Date of Patent: Apr. 28, 2015

(54) PROGRESSIVELY SIZED DIGITALLY-CONTROLLED OSCILLATOR

(71) Applicant: International Business Machines Corporation, Armonk, NY (US)

(72) Inventors: David T. Hui, Poughkeepsie, NY (US); Xiaobin Yuan, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 39 days.

(21) Appl. No.: 13/873,714

(22) Filed: Apr. 30, 2013

(65) Prior Publication Data

US 2014/0320217 A1    Oct. 30, 2014

(51) Int. Cl.
- H03K 3/03 (2006.01)
- H03L 7/099 (2006.01)
- H03L 7/00 (2006.01)

(52) U.S. Cl.
CPC ........................................ *H03L 7/00* (2013.01)

(58) Field of Classification Search
CPC ... H03K 3/0315; H03L 7/0995; H03L 7/0997
USPC ........................................ 331/57, 177 R, 179
See application file for complete search history.

(56) References Cited

U.S. PATENT DOCUMENTS

| | | | | |
|---|---|---|---|---|
| 6,310,523 B1 * | 10/2001 | Chen et al. | ....................... | 331/57 |
| 7,449,961 B2 * | 11/2008 | Sai et al. | ........................... | 331/2 |
| 2005/0162138 A1 | 7/2005 | Kernahan et al. | | |
| 2008/0042755 A1 | 2/2008 | Feygin et al. | | |
| 2008/0122549 A1 | 5/2008 | Greenberg | | |
| 2008/0150645 A1 | 6/2008 | McCorquodale et al. | | |
| 2010/0141315 A1 | 6/2010 | Choi et al. | | |
| 2011/0006851 A1 * | 1/2011 | Kim | ................................ | 331/57 |

FOREIGN PATENT DOCUMENTS

| | | |
|---|---|---|
| CN | 101841332 A | 9/2010 |
| CN | 102130667 A | 7/2011 |
| JP | 2011045006 A | 3/2011 |
| WO | 2009139509 A1 | 11/2009 |

OTHER PUBLICATIONS

Anonymous; "Successive Approximation Frequency Lock Loop Utilizing a Digital Controlled Oscillator"; Jun. 18, 2002; IP.com No. IPCOM000008508D, 4 pages.

(Continued)

*Primary Examiner* — Ryan Johnson
(74) *Attorney, Agent, or Firm* — Cantor Colburn LLP; Margaret McNamara

(57) ABSTRACT

A digitally-controlled oscillator includes a base frequency generator having an odd number of base inverters connected end-to-end to generate an output signal that oscillates at a predetermined frequency and a frequency-adjusting unit connected to the base frequency generator. The frequency-adjusting unit includes a first string of switchable inverters connected in series with each other, the switchable inverters having sizes that decrease from an input end of the first string to the output end of the first string.

14 Claims, 4 Drawing Sheets

(56) References Cited

OTHER PUBLICATIONS

A.V. Rylyakov, et al., "A Wide Power-Supply Range (0.5V-to-1.3V) Wide Tuning Range (500 MHz-to 8 GHz) All-Static CMOS ADPLL in 65nm SOI," Presentation, ISSCC, Feb. 2007, Session 9, Paper 1, pp. 1-20.

Nicola Dalt, et al., "A 10b 10GHz Digitally Controlled LC Oscillator in 65nm CMOS," Solid-State Circuits Conference 2006, IEEE, Feb. 2006, pp. 1-10.

* cited by examiner

PROGRESSIVELY SIZED DIGITALLY-CONTROLLED OSCILLATOR

BACKGROUND

This invention relates generally to digitally-controlled oscillators, and in particular to a digitally-controlled oscillator having progressively-sized inverter elements.

Digitally-controlled oscillators (DCOs) are oscillators having an output frequency that is adjustable by adjusting digital input control signals to the DCO. Conventional DCOs include a base oscillator that generates an output signal at a base frequency and frequency-adjusting stages connected to the base oscillator to adjust the frequency output from the base oscillator. Conventional DCOs suffer from various drawbacks including variations in output frequency steps with the activation of each subsequent frequency-adjusting stage.

FIG. 1 illustrates the differential non-linearity of a conventional DCO having twelve frequency-adjusting stages, where "differential" refers to the frequency difference when activating adjacent stages. When none of the stages are activated, the DCO outputs a base frequency. When one stage is activated, the DCO output frequency increases from the base frequency by F1. Activating stages 2 and 3 increases the DCO output frequency by F2 and F3 respectively. However, when a next stage is activated, the frequency increment drops to a value F4. As illustrated in FIG. 1, although the general trend is for the frequency of the DCO to increase as more stages are activated, the increment is not linear. In some conventional DCOs, the frequency increment or frequency step may oscillate by 10 percent or more of a nominal frequency step indicated by the least-significant-bit of a control byte, word, string or register.

BRIEF SUMMARY

Embodiments of the invention include a digitally-controlled oscillator that includes a base frequency generator having an odd number of base inverters connected end-to-end to generate an output signal that oscillates at a predetermined frequency and a frequency-adjusting unit connected to the base frequency generator. The frequency-adjusting unit includes a first string of switchable inverters connected in series with each other, the switchable inverters having sizes that decrease from an input end of the first string to the output end of the first string.

Embodiments of the invention also include a computer circuit including a digitally-controlled oscillator (DCO) and a controller configured to control a frequency of a signal output by the DCO. The DCO includes a base frequency generator having an odd number of base inverters connected end-to-end to generate an output signal that oscillates at a predetermined frequency. The DCO also includes a frequency-adjusting unit connected to the base frequency generator. The frequency-adjusting unit includes a first string of switchable inverters connected in series with each other, the switchable inverters having sizes that decrease from an input end of the first string to the output end of the first string. The controller is configured to output frequency-adjustment signals to turn on and off the switchable inverters to control a frequency output by the DCO.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

Referring now to the drawings wherein like elements are numbered alike in the several figures.

DETAILED DESCRIPTION

Conventional digitally-controlled oscillators suffer from non-linear frequency responses as consecutive inverter stages are turned on to adjust an output frequency of the digitally-controlled oscillators. Embodiments of the invention relate to a digitally-controlled oscillator having progressively decreasingly-sized inverter elements.

Figure 1:
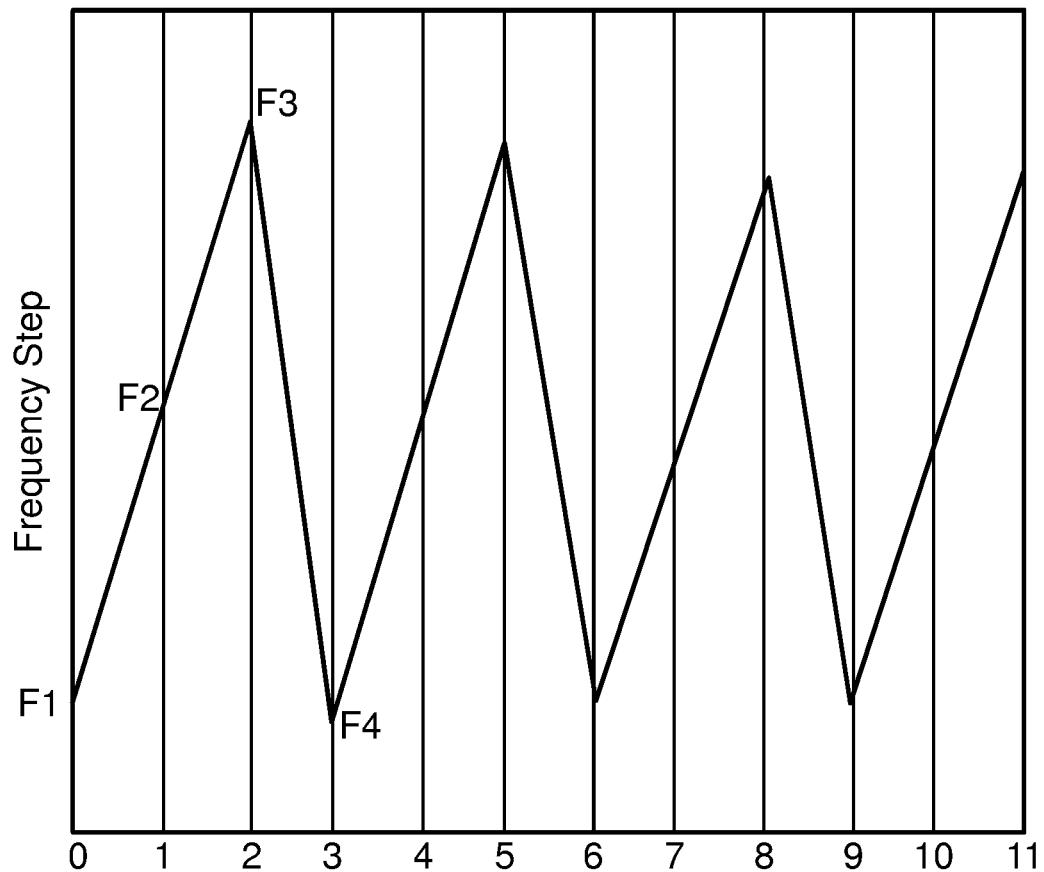
FIG. 1 illustrates a chart of a frequency response of a prior art digitally-controlled oscillator.
Figure 2:
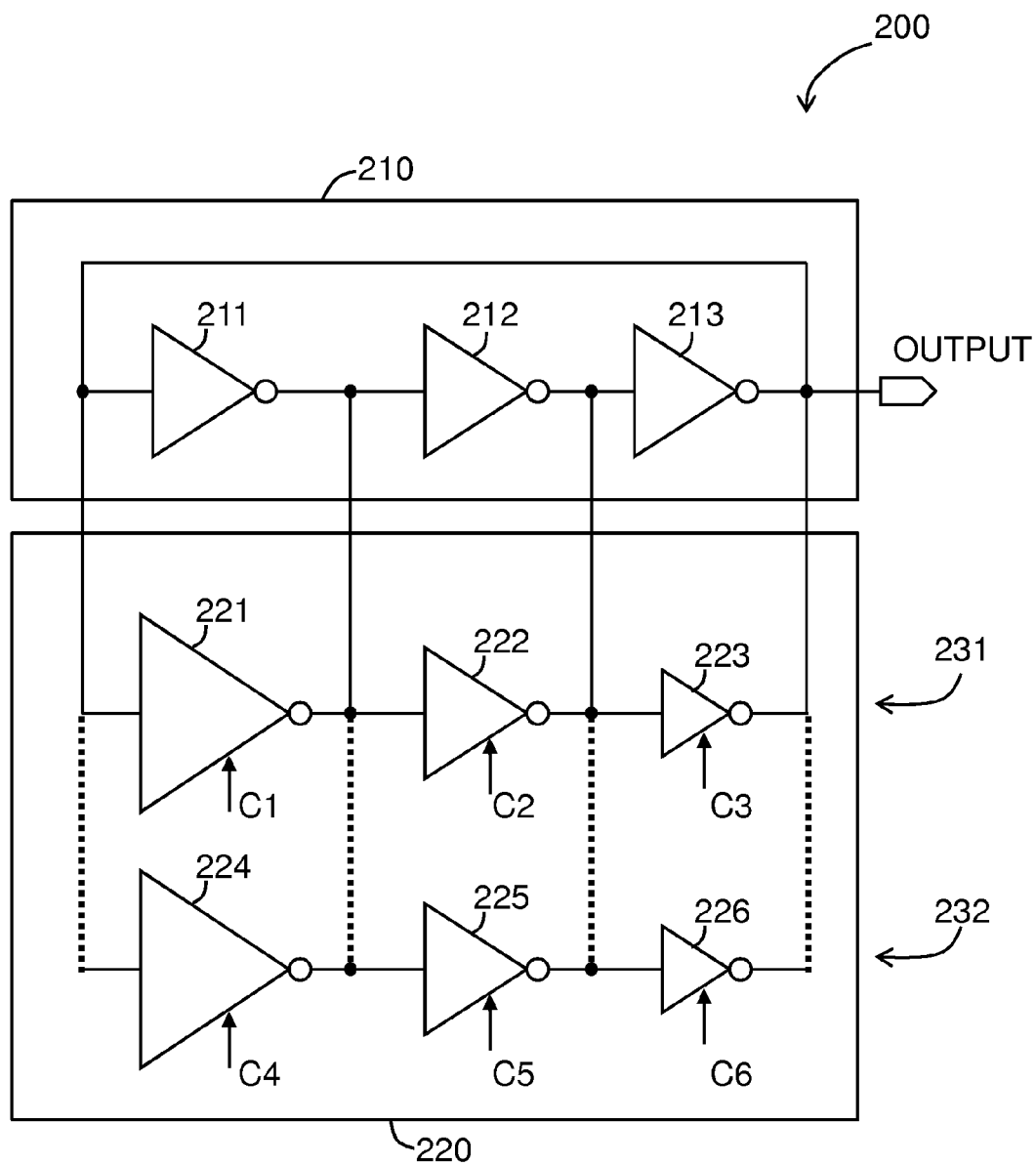
FIG. 2 illustrates a digitally-controlled oscillator according to an embodiment of the invention.

FIG. 2 illustrates a digitally-controlled oscillator (DCO) according to an embodiment of the invention. The DCO 200 includes a base frequency generator 210 and a frequency adjusting unit 220. The base frequency generator includes first, second and third base inverters 211, 212 and 213, where the output of the third inverter 213 is connected to the input of the first inverter 211, generating an output signal (OUTPUT) having a frequency based on the sizes of the base inverters 211, 212 and 213, where a larger size refers to higher driving strength or larger widths of the transistors that make up the base inverters 211, 212 and 213. In operation, turning on the switchable delay component 102 adds more driving current to the circuit and hence reduces the overall delay. In one embodiment of the invention, the first, second and third base inverters 211, 212 and 213 are of the same size. Although only three base inverters 211, 212 and 213 are illustrated in FIG. 2, embodiments of the invention encompass any odd number of base inverters connected in series to generate an oscillating signal.

The frequency-adjusting unit 220 includes at least a first string 231 of switchable inverters 221, 222 and 223 connected in series. The dashed lines in FIG. 2 represent any number of additional strings of switchable inverters, culminating in the string 232 including switchable inverters 224, 225 and 226. For purposes of description, the switchable inverters 221 and 224 are referred to as the first switchable inverters, the switchable inverters 222 and 225 are referred to as the second switchable inverters, and the switchable inverters 223 and 226 are referred to as the third switchable inverters. The switchable inverters 221 to 226 are turned on and off by control signals C1 to C6. In one embodiment, each switchable inverter 221 to 226 may be controlled independently of any other switchable inverter 221 to 226.

While the string 231, referred to as the first string 231, is illustrated as including three switchable inverters 221, 222 and 223 connected in series, embodiments of the invention encompass strings having any odd number of switchable inverters connected in series. In one embodiment, the number of switchable inverters in each string is an odd number. In one embodiment, the number of switchable inverters in each string is the same as the number of base inverters connected in series in the base frequency generator 210.

In one embodiment, the switchable inverters 221, 222 and 223 are connected in parallel with the base inverters 211, 212 and 213. In particular, an input and an output of each switchable inverter 221 to 223 are connected to an input and an output of a corresponding base inverter 211 to 213. As illustrated in FIG. 2, the input of the first switchable inverter 221 is connected to the input of the base inverter 211, the output of the first switchable inverter 221 is connected to the output of the base inverter 211, the output of the second switchable inverter 222 is connected to the output of the base inverter 212, and the output of the third switchable inverter 223 is connected to the output of the base inverter 213.

Similarly, the switchable inverters of each other string in the frequency-adjusting unit 220 are connected in parallel with the switchable inverters 221 to 223 of the first string 231. As illustrated in FIG. 2, the switchable inverters 224, 225 and 226 are connected in parallel with the switchable inverters 221, 222 and 223, respectively.

In embodiments of the invention, the switchable inverters of each string progressively decrease in size from an input end to an output end of each string. For example, the second switchable inverter 222 is smaller than the first switchable inverter 221, and the third switchable inverter 223 is smaller than the second switchable inverter 222. Similarly, the switchable inverter 225 is smaller than the switchable inverter 224, and the switchable inverter 226 is smaller than the switchable inverter 225. The sizes of the switchable inverters 221 to 226 are defined based on the widths of the transistors that make up the switchable inverters 221 to 226, where the width of each transistor is defined as the span in which the gate of the transistor overlaps the well.

In one embodiment, each switchable inverter 221 to 226 is a tri-state inverter made up of four field effect transistors (FETs), two nFETs and two pFETs. One nFET and one pFET are used to invert the signal. Another nFET and pFET are used to control the on/off of the switchable inverter by its control bit. The widths of the FETs in the inverters 221 to 226 are different in order to achieve uniform delay steps. The widths correspond to drive current, such that FETs of different widths pass different drive currents.

In one embodiment, the second switchable inverter 222 is X percent smaller than the first switchable inverter and each subsequent switchable inverter in the string 231 has a size defined as around (Z=X+Y/2) percent smaller than the first switchable inverter, where X is a number between around 5 and around 15, and Y is the size difference between the immediately-preceding switchable inverter and the first switchable inverter in the first string of switchable inverters.

For example, while FIG. 2 illustrates a string 231 having three switchable inverters 221, 222 and 223, in another embodiment the string could include five, seven, etc. switchable inverters. In such an embodiment, if the second switchable inverter in the string is 10 percent smaller than the first switchable inverter in the string, then the size of the third switchable inverter is 15 (or 10+10/2) percent less than the size of the first switchable inverter in the string. Likewise, the size of the fourth switchable inverter in the string is 17.5 (or 10+15/2) percent smaller than the size of the first switchable inverter in the string. In a similar manner, the size of the fifth switchable inverter in the string would be 18.75 (or 10+17.5/2) percent smaller than the size of the first switchable inverter.

In one embodiment, the second switchable inverter 222 is between around 95 percent and around 88 percent of the first switchable inverter 221, and the size of the third switchable inverter 223 is between around 87 percent and around 80 percent of the first switchable inverter 221. In one embodiment, the size of the second switchable inverter 222 is around 90 percent of the first switchable inverter 221, and the size of the third switchable inverter 223 is around 85 percent of the first switchable inverter 221.

In embodiments of the invention, the switchable inverters 221 to 226 are made up of transistors, and decreasing the size of the switchable inverters 222, 223, 225 and 226 relative to the switchable inverters 221 and 224 includes decreasing a size of the transistors of the switchable inverters 222, 223, 225 and 226 relative to the transistors that make up the switchable inverters 221 and 224. In particular, decreasing the size of the switchable inverters 222, 223, 225 and 226 relative to the switchable inverters 221 and 224 includes decreasing widths of the transistors of the switchable inverters 222, 223, 225 and 226 relative to the widths of the transistors that make up the switchable inverters 221 and 224.

Figure 3:
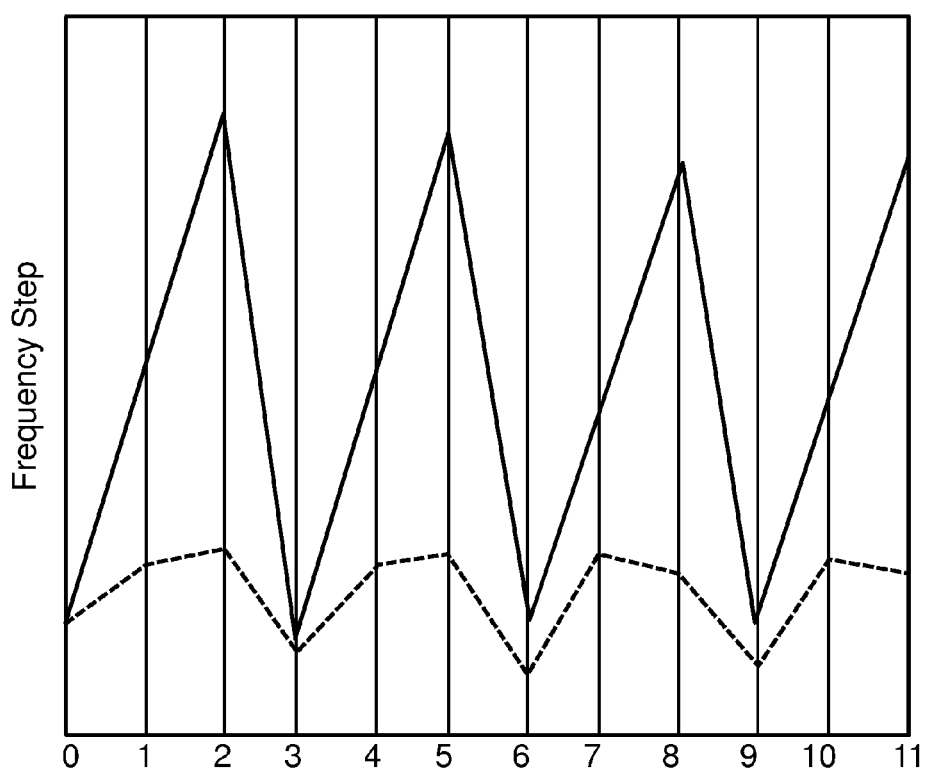
FIG. 3 illustrates a chart of a frequency response of a digitally-controlled oscillator according to an embodiment of the invention.

FIG. 3 illustrates a graph of a frequency step response of a frequency-adjusting unit having four strings of three switchable inverters each, according to an embodiment of the invention. As illustrated in FIG. 3, the output of a conventional digitally controlled oscillator, represented by the solid line, has a frequency step response that oscillates significantly with the activation or deactivation of adjacent switchable inverters of a frequency-adjusting unit. However, as illustrated by the dashed line, the frequency step response of a digitally-controlled oscillator according to embodiments of the invention, having progressively decreasing sizes, results in a significantly more linear frequency step response than conventional DCOs.

Figure 4:
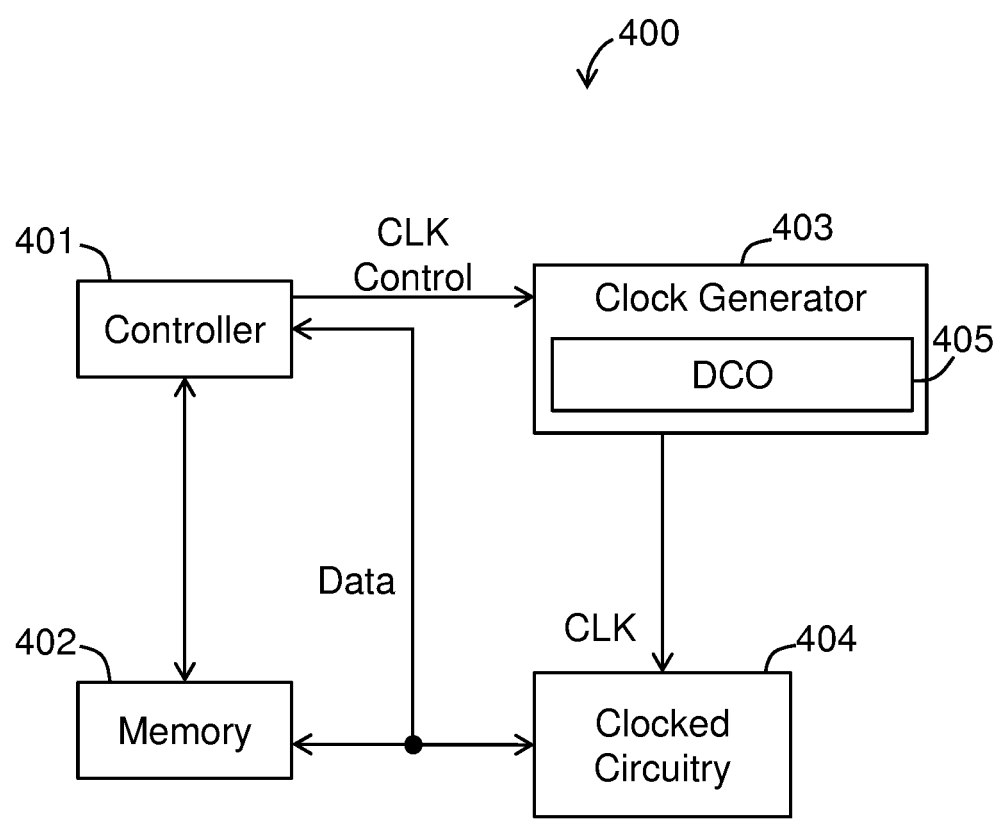
FIG. 4 illustrates a computing circuit including digitally-controlled oscillator according to an embodiment of the invention.

FIG. 4 illustrates a computing circuit 400 according to an embodiment of the invention. The computing circuit 400 includes a controller 401, memory 402, clock generator 403 and clocked circuitry 404. The controller 401 includes a processor and may further include memory and supporting logic circuits. The controller 401 is configured to receive program data, operand data or any other data from memory to process the data to control processes of the computing circuit 400. The controller 401 is also configured to transmit data from memory to the clocked circuitry 404.

The clocked circuitry 404 includes any type of circuitry including control logic circuitry, memory, latches or any other digital circuitry. The clock generator 403 includes a digitally-controlled oscillator (DCO) 405, corresponding to the DCO 200 of FIG. 2, that receives a clock control signal (CLK control) from the controller 401 and outputs a clock signal CLK of a desired frequency to the clocked circuitry 404. The clock generator 403 may include additional circuitry, such as frequency multiplier or divider circuitry, filters or any other desired electronic components.

While an example of a circuit implementing a DCO 200 has been illustrated in FIG. 4 as a computing circuit 400 that generates a clock signal, embodiments of the invention encompass any type of digital circuit requiring a signal having an adjustable frequency, including clock signals, frequency-modulated command signals and frequency-modulated non-command data signals.

Technical effects and benefits include providing adjustable-frequency output signals that may be adjusted in a substantially linear manner with the activation and deactivation of consecutive inverter components or stages. While some technical effects and benefits are described, embodiments of the invention are not limited by the described technical effects and benefits, and some embodiments of the invention may include different technical effects and benefits.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A digitally-controlled oscillator (DCO), comprising:
a base frequency generator having an odd number of base inverters connected end-to-end to generate an output signal that oscillates at a predetermined frequency; and
a frequency-adjusting unit connected to the base frequency generator, the frequency-adjusting unit including a first string of switchable inverters connected in series with each other, the switchable inverters having sizes that decrease from an input end of the first string to an output end of the first string;
wherein the first string of switchable inverters includes a first switchable inverter configured to receive an input signal, a second switchable inverter configured to receive an output from the first switchable inverter, and a third switchable inverter configured to receive an output from the second switchable inverter;
the second switchable inverter is smaller than the first switchable inverter, and the third switchable inverter is smaller than the second switchable inverter; and
the second switchable inverter is X percent smaller than the first switchable inverter, and the third switchable inverter is Y percent smaller than the first switchable inverter, where X is a number between around 5 and around 15, and Y equals X+X/2.

2. The DCO of claim 1, wherein the first string of switchable inverters includes at least three switchable inverters.

3. The DCO of claim 1, wherein the number of switchable inverters is the same as the number of base inverters.

4. The DCO of claim 1, wherein each of the switchable inverters is connected in parallel with a separate base inverter.

5. The DCO of claim 1, wherein the frequency-adjusting unit includes a second string of switchable inverters connected in series with each other and in parallel with the first string of switchable inverters.

6. The DCO of claim 1, wherein the size of the second switchable inverter is between around 95 percent and around 88 percent of the first switchable inverter, and a size of the third switchable inverter is between around 87 percent and around 80 percent of the first switchable inverter.

7. The DCO of claim 1, wherein the size of the second switchable inverter is around 90 percent of the first switchable inverter, and the size of the third switchable inverter is around 85 percent of the first switchable inverter.

8. The DCO of claim 1, wherein the size of the first, second and third switchable inverters is defined by the widths of transistors that make up the first, second and third switchable inverters, such that the transistors that make up the second switchable inverter are narrower than the transistors that make up the first switchable inverter.

9. A digitally-controlled oscillator (DCO), comprising:
a base frequency generator having an odd number of base inverters connected end-to-end to generate an output signal that oscillates at a predetermined frequency; and
a frequency-adjusting unit connected to the base frequency generator, the frequency-adjusting unit including a first string of switchable inverters connected in series with each other, the switchable inverters having sizes that decrease from an input end of the first string to an output end of the first string;
wherein the first string of switchable inverters includes a first switchable inverter configured to receive the same input signal as an input of the base frequency generator, a second switchable inverter having an input connected to an output of the first switchable inverter and at least one additional switchable inverter connected in series with the second switchable inverter,
wherein the second switchable inverter is X percent smaller than the first switchable inverter, and
each of the at least one additional switchable inverters has a size defined as around (Z=X+Y/2) percent smaller than the first switchable inverter, where X is a number between around five and around fifteen, and Y is the size difference between the immediately-preceding switchable inverter and the first switchable inverter in the first string of switchable inverters.

10. A computer circuit, comprising:
a digitally-controlled oscillator (DCO) including a base frequency generator having an odd number of base inverters connected end-to-end to generate an output signal that oscillates at a predetermined frequency, and a frequency-adjusting unit connected to the base frequency generator, the frequency-adjusting unit including a first string of switchable inverters connected in series with each other, the switchable inverters having sizes that decrease from an input end of the first string to the output end of the first string; and
a controller configured to output frequency-adjustment signals to turn on and off the switchable inverters to control a frequency output by the DCO;
wherein the first string of switchable inverters includes a first switchable inverter configured to receive an input signal, a second switchable inverter configured to receive an output from the first switchable inverter, and a third switchable inverter configured to receive an output from the second switchable inverter;
the second switchable inverter is smaller than the first switchable inverter, and the third switchable inverter is smaller than the second switchable inverter; and
the second switchable inverter is X percent smaller than the first switchable inverter, and the third switchable inverter is Y percent smaller than the first switchable inverter, where X is a number between around five and around fifteen, and Y equals X+X/2.

11. The computer circuit of claim 10, wherein each switchable inverter is controllable by frequency-adjustment signals of the controller independently of each other switchable inverter.

12. The computer circuit of claim 10, wherein each of the switchable inverters is connected in parallel with a separate base inverter.

13. The computer circuit of claim 10, wherein the frequency-adjusting unit includes a second string of switchable inverters connected in series with each other and in parallel with the first string of switchable inverters.

14. The computer circuit of claim 10, wherein the size of the second switchable inverter is between around ninety-five percent and around eighty-eight percent of the first switchable inverter, and a size of the third switchable inverter is between around eighty-seven percent and around eighty-percent of the first switchable inverter.

* * * * *